(12) United States Patent
Shintani (10) Patent No.: US 12,169,717 B2
(45) Date of Patent: Dec. 17, 2024

(54) MINIMIZATION METHOD, COMPUTER-READABLE STORAGE MEDIUM, AND MINIMIZATION APPARATUS

(71) Applicant: HONDA MOTOR CO., LTD., Tokyo (JP)

(72) Inventor: Hidekazu Shintani, Tokyo (JP)

(73) Assignee: HONDA MOTOR CO., LTD., Tokyo (JP)

( * ) Notice: Subject to any disclaimer, the term of this patent is extended or adjusted under 35 U.S.C. 154(b) by 371 days.

(21) Appl. No.: 17/579,410

(22) Filed: Jan. 19, 2022

(65) Prior Publication Data

US 2022/0326952 A1    Oct. 13, 2022

(30) Foreign Application Priority Data

Mar. 31, 2021    (JP) .................................. 2021-059935

(51) Int. Cl.
| | |
|---|---|
| *H03M 7/00* | (2006.01) |
| *G06F 9/30* | (2018.01) |
| *G06F 9/345* | (2018.01) |
| *G06F 9/445* | (2018.01) |

(52) U.S. Cl.
CPC .......... *G06F 9/345* (2013.01); *G06F 9/30014* (2013.01); *G06F 9/44505* (2013.01)

(58) Field of Classification Search
CPC .. G06F 9/345; G06F 9/30014; G06F 9/44505; H03M 7/30
USPC .......................................................... 341/51
See application file for complete search history.

(56) References Cited

U.S. PATENT DOCUMENTS 8,077,059 B2 *  12/2011  Davies .................. G06F 16/221
                                                    341/51

FOREIGN PATENT DOCUMENTS

JP         2018090007 A      6/2018

* cited by examiner

*Primary Examiner* — Jean B Jeanglaude (57) ABSTRACT

A minimization method for minimizing the size of a file is provided, the minimization method including preparing an absolute value length that is equal to or larger than the largest data length among the data lengths of the data of a plurally of coordinates, and a plurality of relative value lengths equal to or less than the absolute value length, and identifying a relative value length causing minimization of the size among a plurality of relative value lengths.

20 Claims, 7 Drawing Sheets

| coordinate: i | 1 | 2 | 3 | 4 | 5 |
|---|---|---|---|---|---|
| value(decimal): $x_i$ | 10 | 20 | 30 | 40 | 50 |
| value(binary): $x_i$ | 01010 | 010100 | 011110 | 0101000 | 0110010 |
| $\Delta$value(decimal): $x_i - x_{i-1}$ | - | +10 | +10 | +10 | +10 |
| $\Delta$value(binary): $x_i - x_{i-1}$ | - | 01010 | 01010 | 01010 | 01010 |
| | - | 5 | 5 | 5 | 5 |
| absLength | 8(1byte) | 8(1byte) | 8(1byte) | 8(1byte) | 8(1byte) |
| relUnsignedN$_{1\sim3}$ | 0 | 0 | 0 | 0 | 0 |
| relUnsignedN$_4$ | 0 | 1 | 2 | 3 | 4 |
| relUnsignedN$_{5\sim8}$ | 0 | 0 | 0 | 0 | 0 |
| relSignedN$_{1\sim4}$ | 0 | 1 | 2 | 3 | 4 |
| relSignedN$_5$ | 0 | 0 | 0 | 0 | 0 |
| relSignedN$_{6\sim8}$ | 0 | 0 | 0 | 0 | 0 |

*FIG.3*

| coordinate: i | 1 | 2 | 3 | 4 | 5 |
|---|---|---|---|---|---|
| Data Representation Area (relLength=4) | absolute | relative | relative | relative | relative |

FIG.4

| coordinate: i | 1 | 2 | 3 | 4 | 5 | 6 | 7 | 8 | 9 | 10 |
|---|---|---|---|---|---|---|---|---|---|---|
| value(decimal): $x_i$ | 10 | 12 | 15 | 12 | 32 | 34 | 34 | 32 | 15 | 21 |
| value(binary): $x_i$ | 00001010 | 00001100 | 00001111 | 00001100 | 00100000 | 00100010 | 00100010 | 00100000 | 00001111 | 00010101 |
| $\Delta$value(decimal): $x_i - x_{i-1}$ | - | +2 | +3 | -3 | +20 | +2 | 0 | -2 | -17 | +6 |
| $\Delta$value(binary): $x_i - x_{i-1}$ | - | 010 | 011 | 101 | 010100 | 010 | - | 10 | 101111 | 0101 |
| | - | 3 | 3 | 3 | 6 | 3 | - | 2 | 6 | 4 |
| absLength | 8(1byte) | 8(1byte) | 8(1byte) | 8(1byte) | 8(1byte) | 8(1byte) | 8(1byte) | 8(1byte) | 8(1byte) | 8(1byte) |
| relUnsignedN$_1$ | 0 | 0 | 0 | 0 | 0 | 0 | 0 | 0 | 0 | 0 |
| relUnsignedN$_2$ | 0 | 1 | 2 | 2 | 2 | 3 | 3 | 3 | 3 | 3 |
| relUnsignedN$_3$ | 0 | 0 | 0 | 0 | 0 | 0 | 0 | 0 | 0 | 1 |
| relUnsignedN$_4$ | 0 | 0 | 0 | 0 | 0 | 0 | 0 | 0 | 0 | 0 |
| relUnsignedN$_5$ | 0 | 0 | 0 | 0 | 1 | 1 | 1 | 1 | 1 | 1 |
| relUnsignedN$_{6\sim8}$ | 0 | 0 | 0 | 0 | 0 | 0 | 0 | 0 | 0 | 0 |
| relSignedN$_1$ | 0 | 0 | 0 | 0 | 0 | 0 | 0 | 1 | 0 | 0 |
| relSignedN$_2$ | 0 | 1 | 2 | 3 | 3 | 4 | 4 | 4 | 4 | 4 |
| relSignedN$_3$ | 0 | 0 | 0 | 0 | 0 | 0 | 0 | 0 | 0 | 1 |
| relSignedN$_4$ | 0 | 0 | 0 | 0 | 0 | 0 | 0 | 0 | 0 | 0 |
| relSignedN$_5$ | 0 | 0 | 0 | 0 | 1 | 1 | 1 | 1 | 2 | 2 |
| relSignedN$_6$ | 0 | 0 | 0 | 0 | 0 | 0 | 0 | 0 | 0 | 0 |
| relSignedN$_{7\sim8}$ | | | | | | | | | | |

*FIG.5*

| coordinate: i | 1 | 2 | 3 | 4 | 5 | 6 | 7 | 8 | 9 | 10 |
|---|---|---|---|---|---|---|---|---|---|---|
| Data Representation Area (relLength=3) | absolute | relative | relative | absolute | absolute | relative | No-changed | absolute | absolute | relative |

MINIMIZATION METHOD, COMPUTER-READABLE STORAGE MEDIUM, AND MINIMIZATION APPARATUS

The contents of the following Japanese patent application(s) are incorporated herein by reference:
NO. 2021-059935 filed in JP on Mar. 31, 2021

BACKGROUND

1. Technical Field

The present invention relates to a minimization method, a computer-readable storage medium, and a minimization apparatus.

2. Related Art

Patent document 1 describes that "when the communication load of in-vehicle network increases", "the transmission of data via the in-vehicle network is suppressed in ascending order of the priority controllers." (Paragraph [0010])

PRIOR ART DOCUMENTS

Patent Document

[Patent Document 1] Japanese Patent Application Publication No. 2018-90007

DESCRIPTION OF EXEMPLARY EMBODIMENTS

Hereinafter, the present invention will be described through embodiments of the invention, but the following embodiments do not limit the inventions that fall within the scope of the claims. In addition, not all combinations of features described in the embodiments are essential to the means of solving the invention. In the drawings, the same or similar parts are denoted by the same reference numerals, and redundant description may be omitted.

Figure 1:
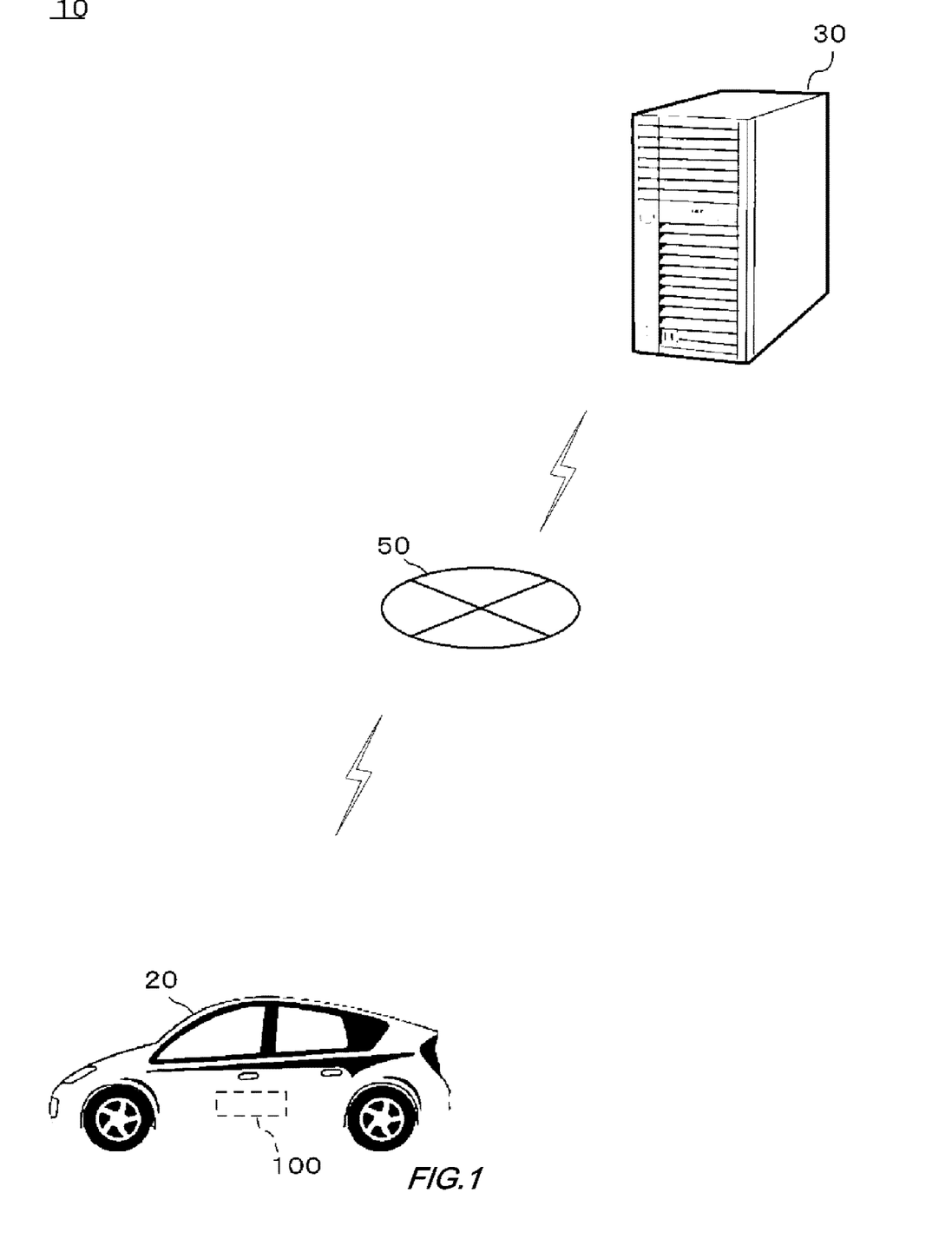
FIG. 1 is a schematic view of a system 10 in one embodiment.

FIG. 1 shows a schematic view of a system 10 in one embodiment. The system 10 includes a vehicle 20 and a server 30 that communicate with each other via a wireless communication network 50. The communication network 50 may include a mobile communication network, an IP network such as the Internet, a P2P network, a dedicated line including VPN, a virtual network, or the like. In the system 10, the vehicle 20 optimizes the data length of the data within the vehicle 20 based on the data collection configuration file received from the server 30, stores it as an uploaded file in a multi-coordinate format, and sends it to the server 30. In the following description, the uploaded file may be simply referred to as a file.

The vehicle 20 has a controller 100. The controller 100 may have, for example, one or more Telematics Control Unit (TCU), and implements a data collection system. The controller 100 can receive/transmit data from/to the server 30 via the communication network 50. It should be noted that the controller 100 is one example of the minimization apparatus.

The controller 100 is an apparatus for minimizing the size of the above-mentioned file. The file can optionally store the data for each of a plurality of coordinates either as an absolute value or a relative value to a previous coordinate. The data stored in the file may be chronological data, may be periodic data with the same time interval, or may be discrete data with different time intervals. However, for the first coordinate of the file, the data must be stored as an absolute value, and for the subsequent coordinates, the data is stored either as a relative value or an absolute value, or only the information about the data is stored without the value of data being stored.

Such file can also be defined as a file format that can be optionally stored as a relative value or stored as an absolute value for the data of each coordinate, or that can be optionally neither stored as a relative value nor as an absolute value. In addition, if neither a relative value nor absolute value is stored for the data of each coordinate, the file may also be a file format that can store the information about the data, for example, a value indicating that there is no change from a previous coordinate, a value indicating anomalous data, a value indicating that the data is in a state of not being obtained, a value indicating that the data is in a state of being restricted, or the like, in a data representation region without storing the value of the data. Said data representation region may be provided for each data of each coordinate within a file. The data representation region may indicate whether the data of each coordinate is stored in a file as a relative value or as an absolute value.

In other words, when producing the described above file, the controller 100 may define, in the data representation region for each coordinate, whether the data of said coordinate is a relative value or absolute value, or whether the value of the data of said coordinate has not changed from the previous coordinate, whether it is anomalous one, whether it is in a state of not being obtained, or whether it is in a state of being restricted.

The controller 100 in the present embodiment collects the data within the vehicle 20 via the in-vehicle network of the vehicle 20. The controller 100 receives the data collection configuration file from the server 30, and, based on the data collection configuration file, optimizes the data length of the collected data such that the size of the file is minimized. The controller 100 stores the data with the optimized data length in a file of a multi-coordinate format thereby, minimizing the size of said file. The controller 100 then sends said file to the server 30.

The controller 100 can also run an allocated computer program to perform a process depending on the computer program. One example of a process which can be performed by the controller 100 includes, for example, a process for controlling a driving source included in the vehicle 20 (for example, at least one of an engine or a motor generator), a process for controlling a brake apparatus included in the vehicle 20, a process for controlling a steering apparatus included in the vehicle 20, a process for controlling a door lock of the vehicle 20, a process for monitoring a state of an occupant in the vehicle 20, a process for monitoring a detected result of a sensor included in the vehicle 20, or the like.

The server 30 is any equipment that can send/receive data to/from the controller 100 of the vehicle 20 via the communication network 50. The server 30 sends the data collection configuration file to the controller 100 of the vehicle 20. Based on the data stored in the file sent from the controller 100 of the vehicle 20, the server 30 may perform a predetermined operation as needed, for example, an operation for controlling the driving of the vehicle 20, an operation for providing information to a user of the vehicle 20 (for example, an occupant), or the like.

Figure 2:
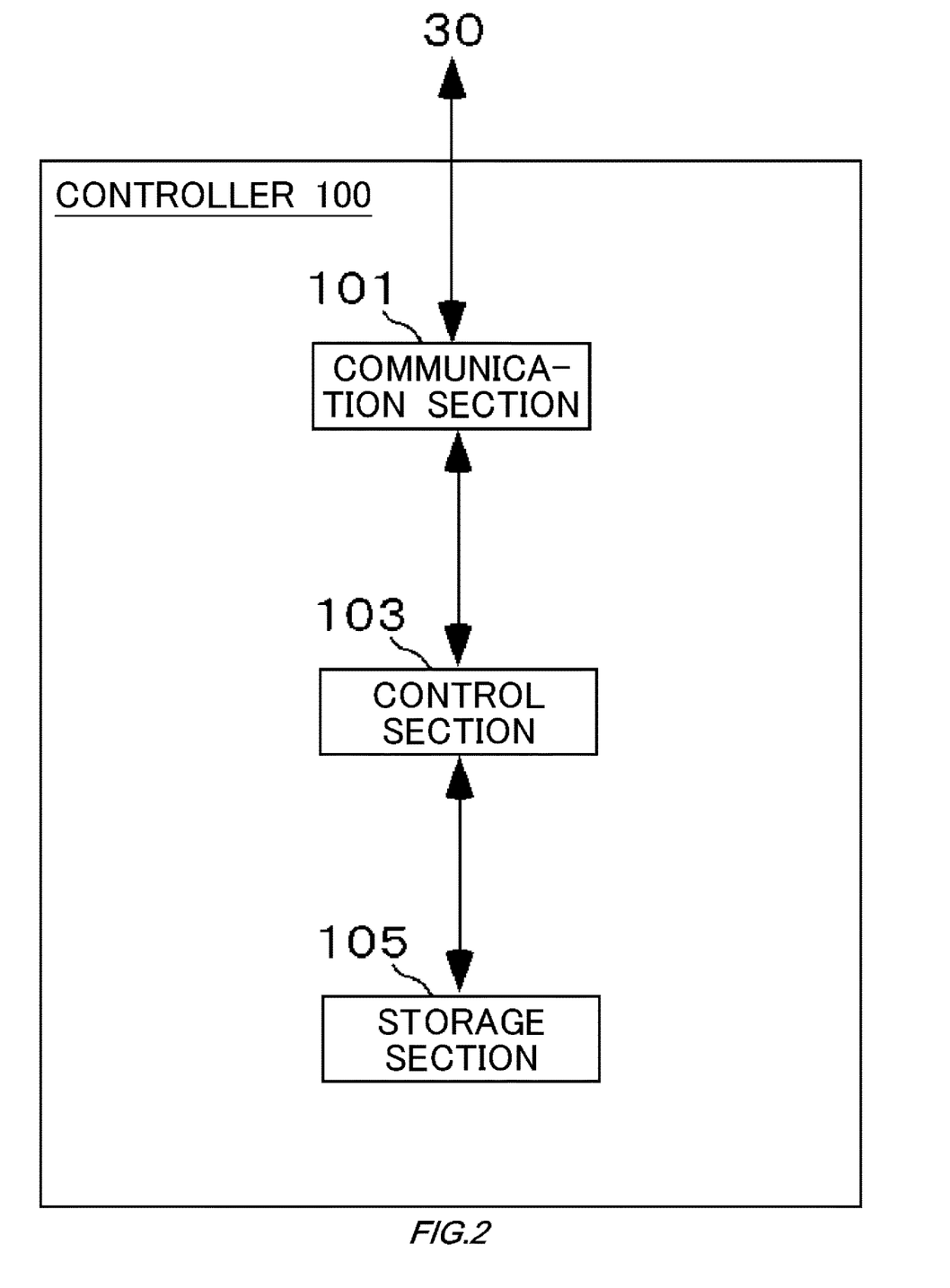
FIG. 2 is a block diagram showing a controller 100 in one embodiment.

FIG. 2 is a block diagram of the controller 100 in one embodiment. The controller 100 includes a communication section 101, a control section 103, and a storage section 105.

The communication section 101 sends/receives data to/from the server 30 via the communication network 50. The communication section 101 receives the data collection configuration file from the server 30 and outputs it to the control section 103. The communication section 101 further receives data from each component within the vehicle 20 via the in-vehicle network in the vehicle 20, for example, the Controller Area Network (CAN) bus, the data bus, or the like, and outputs it to the control section 103. The communication section 101 further sends the file inputted from the control section 103 to the server 30.

When the data collection configuration file is inputted from the communication section 101, the control section 103 obtains the information included in the data collection configuration file, for example, the information indicating the absolute value length of the absolute value to be stored in the file, the information indicating an individual address such as a CANID of a TCU, or the like. The control section 103 collects the data from each component within the vehicle 20 via the communication section 101.

The control section 103 optimizes the relative value length of each data to be stored in the file, by file, i.e. for each file, such that the size of the file in the multi-coordinate format is minimized.

In particular, the control section 103 prepares an absolute value length that is equal to or more than the largest data length among the data lengths for data of a plurality of coordinates, and a plurality of relative value lengths that is equal to or less than the absolute value length. The control section 103 assumes that for each elative value length of said plurality of relative value lengths, among data of a plurality of coordinates, the data with a data length equal to or less than said relative value length is stored in the file as a relative value of said relative value length, and the data with a data length larger than said relative value length is stored in the file as an absolute value of the absolute value length described above. However, the control section 103 may assume that, for the data of any coordinates, only the information related to the data is stored in the file without the value of the data being stored, if a predetermined condition is met. It may also be assumed that, for example, if the relative value of the data of any coordinates to the previous coordinate is 0, in other words, if there is no change from the value of the previous coordinate, the value of said data for said coordinate is not stored in the file but instead the value indicating that there is no change from the previous coordinate is stored in the data representation region. In addition, for example, it may also be assumed that if the data of any coordinates is anomalous, the value of said data for said coordinate is not stored in the file, but instead the value indicating anomalous data is stored in the data representation region.

For all the relative value lengths equal to or less than the prepared absolute value length as described above, if it is assumed that the data is stored in the file as either an absolute value or a relative value as described above or only the information about the data is stored in the file without using the value of the data, the control section 103 identifies the relative value length causing minimization of the size among a plurality of relative value lengths. In this way, for each file, the control section 103 optimizes the relative value length for each data stored in the file.

For each of the plurality of coordinates of each file, the control section 103 stores in the file the data with the data length equal to or less than the relative value length identified in this way as the relative value of said relative value length, and stores the data with the data length larger than said relative value length in the file as the absolute value of the described above absolute value length to minimize the size of the file. However, as described above, for the data meeting a predetermined condition, the control section 103 may store only the information related to the data in the file instead of the value of the data. For the file format of said file, the size of the data representation region for storing said information is preferably a fixed value, for example four bits. Thereby, the control section 103 can perform the above-mentioned optimization process regardless of the data length of the data meeting said condition. It should be noted that, in the following embodiment, when it is described that data is stored in a file as either an absolute value or a relative value, for the data meeting a predetermined condition, only the information related to the data instead of the value of the data may be stored in the file, and the redundant description may be omitted.

The control section 103 sends the file to the server 30 via the communication section 101. The control section 103 may add to said file the information indicating the individual addresses of the above-mentioned TCUs. The control section 103 may temporarily store said file in the storage section 105, read a plurality of files from the storage section 105, and sends it to the server 30. It should be noted that the control section 103 is one example of a preparation section and an identification section.

Figure 3:
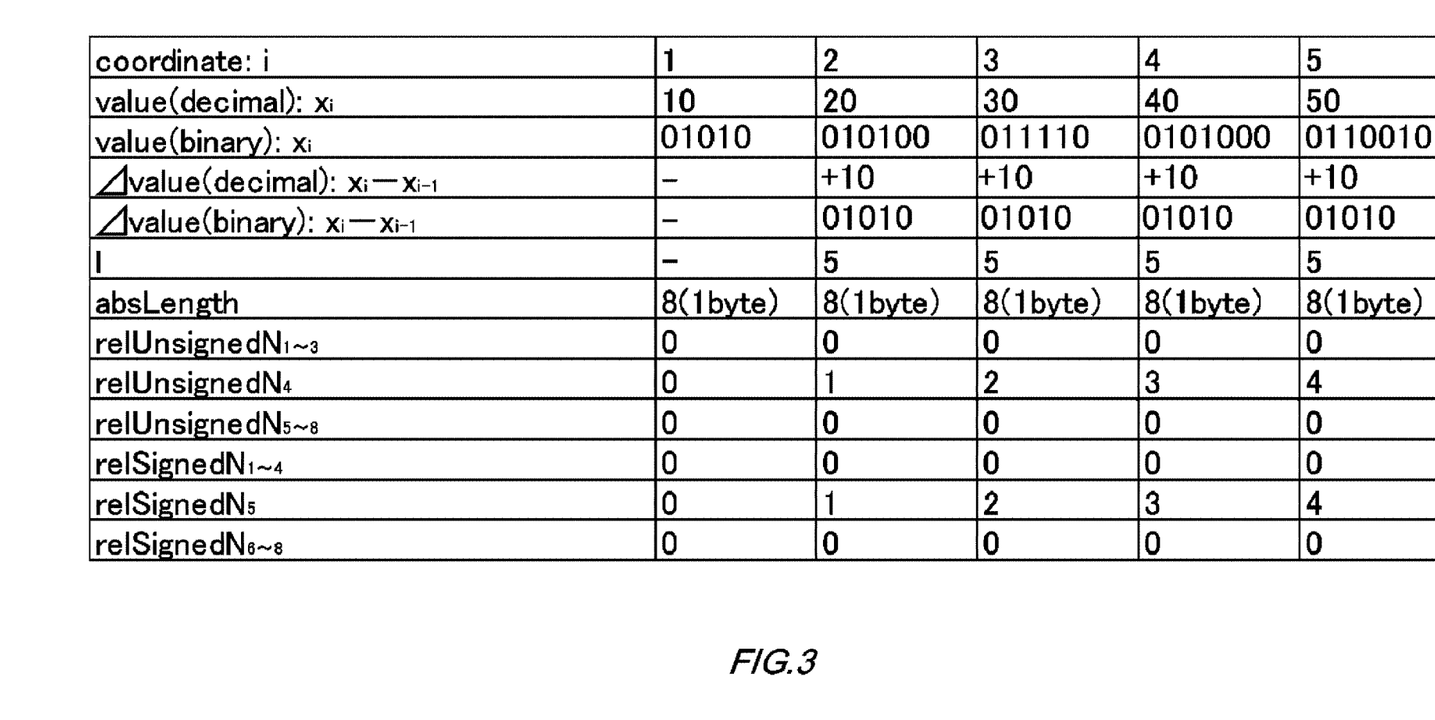
FIG. 3 is a table for describing a first calculation example of a minimization method in one embodiment.

FIG. 3 is a table for describing a first calculation example of a minimization method in one embodiment. The controller 100 in the present embodiment performs the first calculation example of the minimization method shown in FIG. 3, as one example. In particular, the control section 103 of the controller 100 optimizes the relative value length (relLength [bits]) of each data by file, thereby causing minimization of the size of the file in the multi-coordinate format.

In the present embodiment, for each of a plurality of coordinates, the file can optionally store the data as either an absolute value, a relative value to the previous coordinate which is an unsigned relative value without a positive or negative sign, or a relative value to the previous coordinate which is a signed relative value with a positive or negative sign. In other words, for each of a plurality of coordinates, the controller 100 can store the data in the file as any of an absolute value, an unsigned relative value, or a signed relative value.

In the first row in the table shown in FIG. 3, the first column indicates a coordinate: i, and the second column to the sixth column indicate i=1 to i=5. In the second row and the following rows in the table, the first column indicates a plurality of items, and the second column to the sixth column indicate calculated values for each item from the first coordinate to the fifth coordinate.

The item in the second row indicates the absolute value of decimal (value (decimal)):$x_i$, and the item in the third row indicates the absolute value of binary (value (binary)):$x_i$. The item in the fourth row indicates the relative value of decimal (Δ value (decimal)):$x_i-x_{i-1}$, and the item in the fifth row indicates the relative value of binary (Δ value (binary)): $x_i-x_{i-1}$.

The item in the sixth row indicates the relative value length l in the signed binary number representation. Among the relative value length l, one bit indicates a positive or negative sign. Therefore, the relative value length in the unsigned binary number representation is l−1.

The item in the seventh row indicates the absolute value length of the absolute value to be stored in the file (absLength [bits]), which is for example included in the information of the data collection configuration file. The item from the eighth row to the tenth row indicates the maximum recording number of the relative value length l−1 in the unsigned binary number representation, that is, the number of data stored as the relative value of said relative value length l−1 (relUnsignedN$_{l-1}$ (l−1=1, 2, . . . , absLength)). More specifically, the eighth row indicates the number of data with the relative value length being any of one bit to three bits (relUnsignedN$_{1\ to\ 3}$), the ninth row indicates the number of data with the relative value length being four bits (relUnsignedN$_4$), and the tenth row indicates the number of data with the relative value length being any of five bits to eight bits (relUnsignedN$_{5\ to\ 8}$). It should be noted that herein for only the purpose of clear description, those with different relative value lengths but the recording number of all the coordinates being 0, for example, those with the relative value length being from one bit to three bits are indicated together in one row, which is the same for the following description, and the redundant description is omitted.

The items from the eleventh row to the thirteenth row indicates the maximum recording number of the relative value length l in the signed binary number representation, that is, the number of data stored as the relative value with said relative value length l (relSignedN$_l$ (l=1, 2, . . . , absLength)). More specifically, the eleventh row indicates the number of data with the relative value length being any of one bit to four bits (relSignedN$_{1\ to\ 4}$), the twelfth row indicates the number of data with the relative value length being five bits (relSignedN$_5$), and the thirteenth row indicates the number of data with the relative value length being any of six bits to eight bits (relSignedN$_{6\ to\ 8}$).

In the present embodiment, if the number N of the coordinates of the file is equal to or more than two as in the first calculation example, the control section 103 of the controller 100 optimizes the relative value length of all the data of said file in the following manner. However, if the absolute value length included in the information of the data collection configuration file is one bit, the control section 103 does not identify the relative value length minimizing the file size, but determines to store the data of a plurality of coordinates in the file as an absolute value of one bit. In this case, the control section 103 may fix the relative value length to 0 bit. It should be noted that if the number N of coordinates of the file is one, the control section 103 cannot store the data in said file as a relative value, which makes said optimization process unnecessary.

If the absolute value length included in the information of the data collection configuration file is larger than one bit, the control section 103 optimizes the relative value length in the following manner. That is, if the absolute value length is eight bits (one byte) as indicated in the eighth row of the table, the control section 103 optimizes the relative value length in the following manner.

The control section 103 performs preparation from one bit by one, bit as a plurality of relative value lengths equal to or less than the absolute value length. In the exemplary calculation 1 shown in FIG. 3, the control section 103 prepares a plurality of relative value lengths by counting up from one bit to 8 bit, which is the same as the absolute value length, such that 2 bit, 3 bit, . . . , 8 bit.

Herein, as shown in the table of FIG. 3, the current coordinate is defined as i and the absolute value of the current ordinate is defined as $x_i$. In addition, for the difference between the current coordinate and the previous coordinate, that is, the relative value $x_i-x_{i-1}$, the relative value length in the unsigned binary number representation is defined as l−1, and the relative value length in the signed binary number representation is defined as l.

The control section 103 counts the maximum recording number relUnsignedN$_{l-1}$ (l−1=1, 2, . . . , 8) of the relative value length l−1 in the unsigned binary number representation and the maximum recording number relSignedN$_l$ (l=1, 2, . . . , 8) of the relative value length l in the signed binary number representation according to the following rules 1 to 5 in the range from 2≤i≤N with each of the initial value being 0.

1. If 1 is larger than the absolute value length, the count is not performed.

2. if the absolute value $x_i$ of the current coordinate and the absolute value $x_{i-1}$ of the previous coordinate are in the state of not being obtained or are anomalous the count is not performed. It should be noted that, as one example, the state in which the absolute values have not been obtained for each coordinate or the anomalous state may be indicated in the above-mentioned data representation region.

3, If the relative value $x_i-x_{i-1}$ is 0, that is, the absolute value $x_i$ of the current coordinate has not changed from the absolute value $x_{i-1}$ of the previous coordinate, the count is not performed. It should be noted that, as one example, the state in which there is no change from the previous coordinate for each coordinate may be indicated in the above-mentioned data representation region.

4. If the relative value $x_i-x_{i-1}$ is larger than 0, the count is performed with the unsigned maximum recording number relUnsignedN$_l$=relUnsignedN$_{l-1}$+1 and the signed maximum recording number relSignedN$_l$=relSignedN$_{l-1}$+1.

5. If the relative value $x_i-x_{i-1}$ is less than 0, the count is performed with the signed maximum recording number relSignedN$_l$=relSignedN$_{l-1}$+1.

With respect to the described above rule 2, the control section 103 assumes that, if data is in a state of not being obtained, is an abnormal value, or is in a state of being restricted, the value of said data is not stored in the file.

With respect to the described above rule 3, the control section 103 assumes that, if data has the relative value to the previous coordinate being zero, the value of said data is not stored in the file.

If the control section 103 assumes that in any coordinates the value of the data is not stored in the file, for the next coordinate of said coordinate, it goes back to the value of the previous coordinate of said coordinate and, in a case of said previous coordinate being an absolute value, it may assume that the data of said next coordinate is stored in the file as a relative value, or otherwise it may assume that the data is stored in the file as an absolute value. Alternatively, if the control section 103 assumes that in any coordinates the value of the data is not stored in the file, it may assume that, for the next coordinate of said coordinate, the data is stored in the file as the relative value to said absolute value, as long as it is assumed that the absolute value is stored as any coordinates before said next coordinate.

With respect to the described above rule 5, in a case of the unsigned relative value, the control section 103 assumes that, if the relative value to the previous coordinate is a negative value, the data of said coordinate is stored in the file as an absolute value of the absolute value length.

The control section 103 identifies a relative value length that minimizes the size of a file, for each of the unsigned relative value and the signed relative value. More specifically, the control section 103 calculates the size of data reduced by storing as the relative value. That is, for each relative value length of the plurality of relative value lengths, the control section 103 calculates the product of the number of the data to be stored in the file as a relative value of the relative value length and the difference between the absolute value length and the relative value length, and identifies a relative value length resulting in the largest absolute value of the product as the relative value length causing minimization of the size of the file.

In other words, the control section 103 calculates the smallest relative value length u in the unsigned binary number representation as shown in the following Equation 1, and calculates the smallest relative value length s in the signed binary number representation as shown in the following Equation 2. The smallest relative value length u is a relative value length causing minimization of the size of the file in a case of the unsigned relative value. Similarly, the smallest relative value length s is a relative value length causing minimization of the size of the file in a case of the signed relative value.

Equation 1

$$\min_{1 \le u \le absLength} \left\{ (u - absLength) \sum\nolimits_{K=1}^{u} relUnsignedN_k \right\} \quad [F1]$$

Equation 2

$$\min_{1 \le s \le absLength} \left\{ (s - absLength) \sum\nolimits_{K=1}^{s} relSignedN_k \right\} \quad [F2]$$

The control section 103 performs calculation in the curly bracket in [F1] described above for each of the relative value lengths u=1 to 8 in the unsigned binary number representation based on the data indicated in the eighth row to the tenth row of the table in FIG. 3. In other words, the control section 103 performs the calculation: (1−8)×0=0 in a case of u=1, (2−8)×0=0 in a case of u=2, (3−8)×0=0 in a case of u=3, (4-8)×4=−16 in a case of u=4. In addition, the control section 103 performs calculation: (5−8)×4=−12 in a case of u=5, (6−8)×4=−8 in a case of u=6, (7−8)×4=−4 in a case of u=7, (8−8)×4=0 in a case of u=8. In this case, the control section 103 performs the calculation: [F1]=−16 (in a case of u=4).

In addition, the control section 103 performs the calculation in the curly bracket in [F2] described above for each of the relative value lengths s=1 to 8 in the signed binary number representation based on the data indicated in the eleventh row to the thirteenth row of the table in FIG. 3. In other words, the control section 103 performs the calculation: (1−8)×0=0 in a case of s=1, (2−8)×0=0 in a case of s=2, (3−8)×0=0 in a case of s=3, and (4−8)×0=0 in a case of s=4. In addition, the control section 103 performs the calculation: (5−8)×4=−12 in a case of s=5, (6−8)×4=−8 in a case of s=6, (7−8)×4=−4 in a case of s=7, and (8−8)×4=0 in a case of s=8. In this case, the control section 103 performs the calculation: [F2]=−12 (in a case of s=5).

The control section 103 compares the size of the file according to the relative value length identified in a case of the unsigned relative value to the size of the file according to the relative value length identified in a case of the signed relative value to identify the relative value length with the smaller size of the file. In particular, the control section 103 compares [F1] and [F2] calculated above to determine which is higher. In a case of [F1]≤[F2], it identifies the smallest relative value length u as the optimal relative value length. In a case of [F1]>[F2], it multiplies the smallest relative value length s by −1 and identifies −s as the optimal relative value length.

In other words, based on the calculation result described above, the control section 103 determines that [F1]=−16<[F2]=−12 and identifies u=4 [bits] as the optimal relative value length. It should be noted that if [smallest relative value length u]=[smallest relative value length s]=[absolute value length absLength], the optimal relative value length is 0 bit and the data is stored in the file as an absolute value length.

It should be noted that the control section 103 may not calculate the product for a relative value length larger than the largest data length in the data lengths of the data of the plurality of coordinates, among the relative value lengths of each of the plurality of relative value lengths. In other words, the control section 103 may not perform the calculation within the curly bracket in [F1] described above for u=8 among the relative value lengths u=1 to 8 in the unsigned binary number representation. In addition, the control section 103 may not perform the calculation within the curly bracket in [F2] described above for s=8 among the relative value lengths s=1 to 8 in the signed binary number representation.

Figure 4:
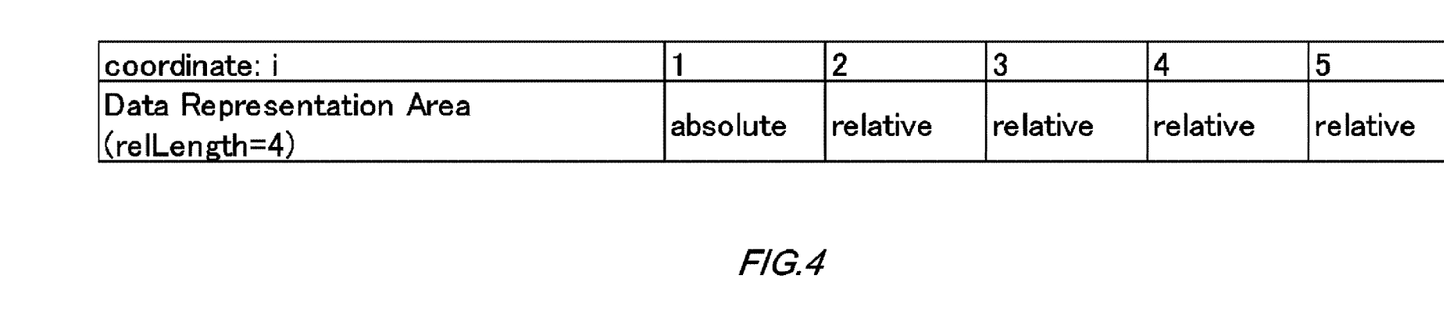
FIG. 4 is a table for describing the optimal relative value length identified by the first calculation example in FIG. 3.

FIG. 4 is a table for describing the optimal relative value length identified by the first calculation example in FIG. 3. In the first row in the table shown in FIG. 4, the first column indicates a coordinate: i, and the second column to the sixth column indicate i=1 to i=5. The item in the second row indicates whether the data of each coordinate is stored in the file as a relative value (relative) or an absolute value (absolute) in the data representation region provided for each coordinate within the file. However, the first column in the second row indicates the optimal relative value length (relLength=4 [bits]) identified in the exemplary calculation 1 of FIG. 3, along with the name of the item.

Figure 5:
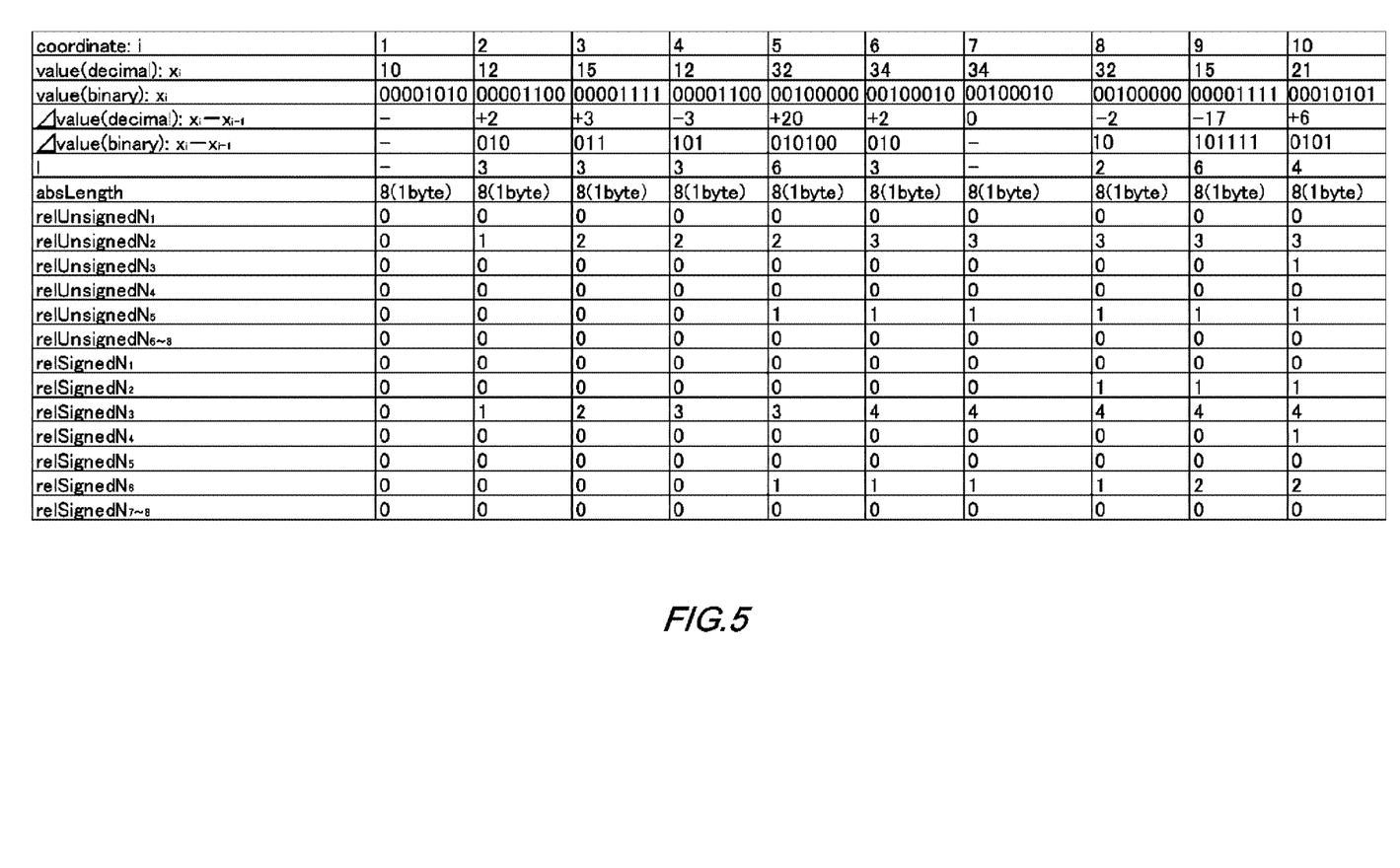
FIG. 5 is a table for describing a second calculation example of a minimization method in one embodiment.

FIG. 5 is a table for describing a second calculation example of a minimization method in One embodiment. The controller 100 in the present embodiment performs the second calculation example of the minimization method shown in FIG. 5, as one example. The minimization method shown in FIG. 5 is the same as the minimization method described above together with FIG. 3 and redundant descriptions are appropriately omitted.

In the first row in the table shown in FIG. 5, the first column indicates a coordinate:i, and the second column to the eleventh column indicate i=1 to i=10. In the second row and the following rows in the table, the first column indicates a plurality of items, and the second column to the eleventh column indicate a calculated value for each item from the first coordinate to the tenth coordinate.

The items from the second row to the seventh row are the same as the items from the second row to the seventh row in the table of FIG. 3.

The items from the eighth row to the thirteenth row indicate the maximum recording number of the relative value length l−1 in the unsigned binary number representation, that is, the number of data stored as the relative value of said relative value length l−1 (relUnsignedN$_{l-1}$ l−1=1, 2, . . . , absLength)). More specifically, the eighth row to the twelfth each indicates the number of the data (relUnsignedN$_1$, relUnsignedN$_2$, relUnsignedN$_3$, relUnsignedN$_4$, relUnsignedN$_5$) with the relative value length being each of one bit to five bits. The thirteenth row indicates the number of the data (relUnsignedN$_{6\ to\ 8}$) with the relative value length being any of six bits to eight bits.

The items from the fourteenth row to the twenty-first row indicate the maximum recording number of the relative value length l in the signed binary number representation, that is, the number of data stored as the relative value with said relative value length l (relSignedN$_l$ (l=1, 2, . . . , absLength)). More specifically, the fourteenth row to the twentieth row each indicates the number of the data (relUnsignedN$_1$, relUnsignedN$_2$, relUnsignedN$_3$, relUnsignedN$_4$, relUnsignedN$_5$, relUnsignedN$_6$) with the relative value length being each of one bit to six bits. The twenty-first row indicates the number of the data (relUnsignedN$_{7\ to\ 8}$) with the relative value length being any of seven bits to eight bits.

In the present embodiment, the control section 103 performs the calculation in the curly bracket in [F1] described above for each of the relative value lengths u=1 to 8 in the unsigned binary number representation based on the data indicated in the eighth row to the thirteenth row of the table in FIG. 5. In other words, the control section 103 performs the calculation: (1−8)×0=0 in a case of u=1, (2−8)×3=−18 in a case of u=2, (3−8)×4=−20 in a case of u=3, (4−8)×4=−16 in a case of u=4. In addition, the control section 103 performs calculation: (5−8)×5=−15 in a case of u=5, (6−8)×5=−10 in a case of u=6, (7−8)×5=−5 in a case of u=7, (8−8)×5=0 in a case of u=8. In this case, the control section 103 performs the calculation: [F1]=−0 (in a case of u=4).

In addition, the control section 103 performs the calculation in the curly bracket in [F2] described above for each of the relative value lengths s=1 to 8 in the signed binary number representation based on the data indicated in the fourteenth row to the twenty-first row of the table in FIG. 5. In other words, the control section 103 performs the calculation: (1−8)×0=0 in a case of s=1, (2−8)×1=−6 a case of s=2, (3−8)×5=−25 in a case of s=3, and (4−8)×6=−4 in a case of s=4. In addition, the control section 103 performs the calculation: (5−8)×6=−18 in a case of s=5, (6−8)×8=−16 in a case of s=6, (7−8)×8=−8 in a case of s=7, and (8−8)×8=0 in a case of s=8. In this case, the control section 103 performs the calculation: [F2]=−25 (in a case of s=3).

Based on the calculation result described above, the control section 103 determines that [F1]=−20>=[F2]=−25, and identifies−s=−3 [bits] as the optimal relative value length.

Figure 6:
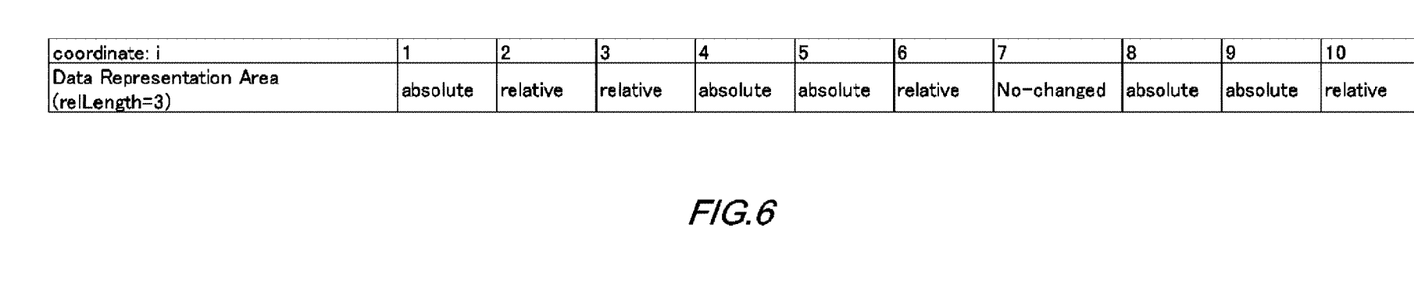
FIG. 6 is a table for describing the optimal relative value length identified by the second calculation example in FIG. 5.

FIG. 6 is a table for describing the optimal relative value length identified by the second calculation example in FIG. 5. In the first row in the table shown in FIG. 6, the first column indicates a coordinate:i, and the second column to the eleventh column indicate i=1 to i=10. The item in the second row indicates whether the data of each coordinate is stored in the file as a relative value (relative) or an absolute value (absolute) in the data representation region provided for each coordinate within the file, or that only the information related to the data is stored in the file without using the value of the data. However, the first column in the second row indicates the optimal relative value length (relLength=3 [bits]) identified in the exemplary calculation 2 of FIG. 5, along with the name of the item. It should be noted that, in the illustrated example, the data representation region in the seventh coordinate indicates that there is no change from the previous coordinate (No-changed) as understood with reference to the table of FIG. 5.

With the controller 100 in the present embodiment as described above, the minimization method for minimizing the size of the file is performed. The file can optionally store the data for each of a plurality of coordinates either as an absolute value or a relative value to a previous coordinate. The minimization method includes preparing the absolute value length equal to or larger than the largest data length among the data lengths of the data of a plurality of coordinates and a plurality of relative value lengths equal to or less than the absolute value length. The minimization method further includes, for each relative value length of said plurality of relative value lengths, among data of a plurality of coordinates, assuming that the data with a data length equal to or less than said relative value length is stored in the file as a relative value of said relative value length, and the data with a data length larger than said relative value length is stored in the file as an absolute value of the absolute value length described above, and identifying the relative value length causing minimization of the size among the plurality of relative value lengths. In this way, the controller 100 optimizes, for each file, the relative value length of each data stored in the file to minimize the size of the file.

The minimization method in the present embodiment optimizes, for example by the controller 100 of the vehicle 20, the relative value length of each data for each file, but a possible comparative example of the minimization method in the present embodiment includes a method of predefining the relative value length of each data to be stored in each file within the data collection configuration file that is sent to the vehicle by the server, for example. In such a comparative example, the optimal value that covers all the use cases cannot be set, the relative value length cannot be changed for each file (for each time), and the file size cannot be optimized. In addition, maintaining such a non-optimized relatively large file in the server in a large amount consumes the storage area of the server, resulting in a high cost.

In addition, a possible other comparative example includes, for example, sending, by the vehicle, the file compressed through an encoding process such as Zip to the server and maintaining a large amount of compressed files in the server. In such a comparative example, the content of the file cannot be reviewed without decoding the compressed file, and all the compressed files in at least a certain period need to be decoded and read for a specific value to be found from the data within a large amount of compressed files maintained in the server. Therefore, the processing load for decoding in a case where the compressed file is utilized is high, resulting in a high processing cost.

In contrast, according to the minimization method in the present embodiment including the configuration described above, a relative value length that can minimize the file size is identified for each file by utilizing a file format that enables the data to be optionally stored as any of an absolute value of the absolute value length or a relative value of the relative value length equal to or less than the absolute value length for each coordinate. According to said minimization method, the data which can be stored with the relative value length identified for each file in this way is stored in the file as a relative value and the remained data is stored in the file as an absolute value, or, in a case where a predetermined condition is net, only the information related to the data is stored in the file in the data representation region with, for example, a fixed data length without storing the value of the data, thereby minimizing the file size. Thus, according to said minimization method, the communication volume of the file sent from the vehicle 20, including the controller 100 that performs said minimization method, to the server 30 can be reduced relative to the comparative example described above, and, for the server 30, the storage area and storage cost of the file and the processing load and processing cost that occur when utilizing the file can be reduced relative to the comparative example described above.

In addition, according to the minimization method described in the present embodiment described above, the file size can be optimized by bit depending on the change in the value of each data. In addition, accommodating both the signed and unsigned relative value length can optimize the file size regardless of the sign of the absolute value length or whether the relative value is positive or negative. In addition, since the relative value can be optimized for each vehicle 20 (user)/each time (by file), the file size can be optimized in accordance with the individual property of a human or a part and the file size can be optimized in accordance with the situation that constantly changes. In addition, the optimization can be limited to an only minimal level in accordance with the performance of the edge.

In the embodiment described above, for each of a plurality of coordinates, a plurality of data with different types can be optionally stored in the file either as an absolute value or a relative value to the previous coordinate. In this case, since there is no correlation among the plurality of data with different types, the minimization method described above may include preparing and identifying, which are independent for each type of data. In addition, in this case, for example, the data representation region for each coordinate described above may define whether, for each of the plurality of data with different types, said data is a relative value or an absolute value, or whether the value of said data has not changed from the previous coordinate, is anomalous, is in a state of not being obtained, or in a state of being restricted, or the like, In the embodiment described above, the controller 100 of the vehicle 20 may perform the above-mentioned optimization method at a timing when the data recorded in each coordinate is maintained in the storage section 105, without performing the optimization method described above to calculate all together the relative value length of each data when producing the file to be sent to the server 30. Thus, the processing load can be distributed and the load for producing the file can be suppressed.

In the embodiment described above, the smallest relative value length may be calculated and recorded in the file so that whether the data of each coordinate is stored as a relative value or stored as an absolute value can be switched later in the data representation region for each coordinate.

In the embodiment described above, assuming the case in which the processing power at the edge side is low and all the data cannot be processed, the target data may be specified at the server or said data can be selected by the vehicle so that the relative value can be optimized only for the data for which the optimization of the relative value can empirically contribute to the optimization of the file size.

Various embodiments of the present invention may be described with reference to flowcharts and block diagrams whose blocks may represent (1) steps of processes in which operations are performed or (2) sections of apparatuses responsible for performing operations. Certain steps and sections may be implemented by dedicated circuitry, programmable circuitry supplied with computer-readable instructions stored on computer-readable media, and/or processors supplied with computer-readable instructions stored on computer-readable media. Note that dedicated circuitry may include digital and/or analog hardware circuits, and may include integrated circuits (IC) and/or discrete circuits. Programmable circuitry may include reconfigurable hardware circuits comprising logical AND, OR, XOR, NAND, NOR, and other logical operations, flip-flops, registers, memory elements, etc., such as field-programmable gate arrays (FPGA), programmable logic arrays (PLA), and the like.

A computer-readable medium may include any tangible device that can store instructions to be executed by a suitable device, and as a result, the computer-readable medium having instructions stored thereon comprises an article of manufacture including instructions which can be executed to create means for performing operations specified in the flowcharts or block diagrams. Examples of computer-readable media may include an electronic storage medium, a magnetic storage medium, an optical storage medium, an electromagnetic storage medium, a semiconductor storage medium, etc. More specific examples of the computer-readable medium may include a Floppy (registered trademark) disk, a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a compact disc read-only memory (CD-ROM), a digital versatile disk (DVD), a BLU-RAY (registered trademark) disc, a memory stick, an integrated circuit card, and the like.

Computer-readable instructions may include assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, JAVA (registered trademark), C++, etc., and conventional procedural programming languages, such as the "C" programming language or similar programming languages.

Computer-readable instructions may be provided to a processor of a general purpose computer, special purpose computer, or other programmable data processing apparatus, or to a programmable circuitry, locally or via a local area network (LAN), wide area network (WAN) such as the Internet, or the like, to execute the computer-readable instructions to create means for performing operations specified in the flowcharts or block diagrams. Examples of the processor include a computer processor, a processing unit, a microprocessor, a digital signal processor, a controller, a microcontroller, and the like.

Figure 7:
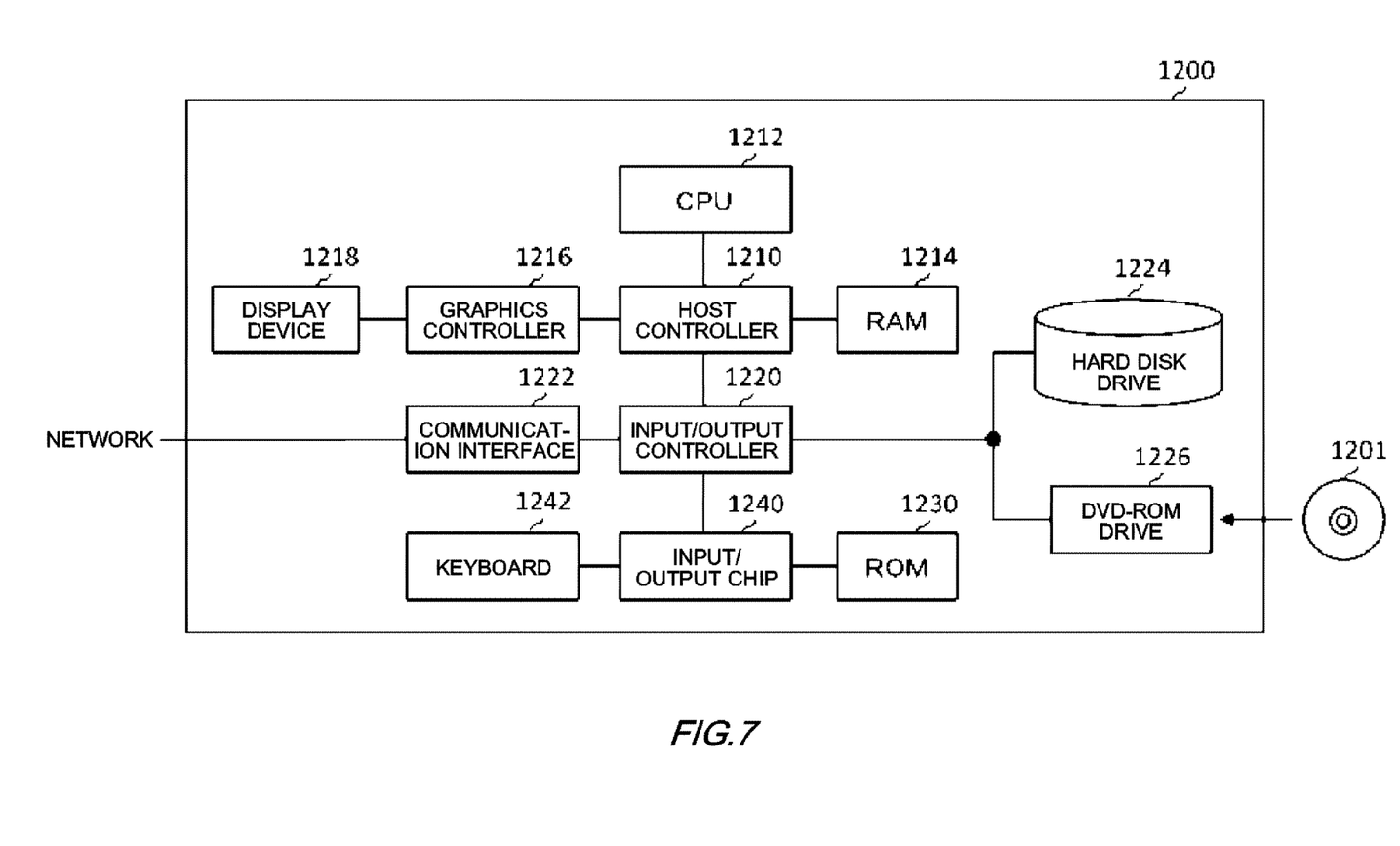
FIG. 7 is a diagram showing an example of a computer 1200 in which a plurality of aspects of the present invention can be entirely or partially embodied.

FIG. 7 shows an example of the computer 1200 which can embody a plurality of aspects of the present invention entirely or partially. A program installed on the computer 1200 can cause the computer 1200 to function as an operation associated with an apparatus according to embodiments of the present invention or as one or more "unit(s)" of the apparatus, or to perform the operation or the one or more "unit(s)", and/or can cause the computer 1200 to perform processes according to embodiments of the present invention or steps of the processes. Such a program may be executed by a CPU 1212 to cause the computer 1200 to perform particular operations associated with some or all blocks in the flowcharts or block diagrams described herein.

The computer 1200 according to the present embodiment includes a CPU 1212, a RAM 1214, a graphics controller 1216 and a display device 1218, which are connected to each other by a host controller 1210. The computer 1200 also includes input/output units such as a communication interface 1222, a hard disk drive 1224, a DVD-ROM drive 1226 and an IC card drive, which are connected to the host controller 1210 via an input/output controller 1220. The computer also includes legacy input/output units such as a ROM 1230 and a keyboard 1242, which are connected to the input/output controller 1220 via an input/output chip 1240.

The CPU 1212 operates in accordance with programs stored in the ROM 1230 and the RAM 1214, and controls each unit accordingly. The graphics controller 1216 acquires image data generated by the CPU 1212 on a frame buffer or the like provided in the RAM 1214 or in the graphics controller 1216 itself, and displays the Image data on the display device 1218.

The communication interface 1222 communicates with other electronic devices via a network. The hard disk drive 1224 stores programs and data to be used by the CPU 1212 in the computer 1200. The DVD-ROM drive 1226 reads programs or data from the DVD-ROM 1201, and provides the programs or data to the hard disk drive 1224 via the RAM 1214. The IC card drive reads the program and data from the IC card, and/or writes the program and data to the IC card.

The ROM 1230 has stored therein a boot program or the like to be executed by the computer 1200 at the time of activation, and/or a program that depends on the hardware of the computer 1200. The input/output chip 1240 may also connect various input/output units to the input/output controller 1220 via a parallel port, a serial port, a keyboard port, a mouse port or the like.

Programs are provided by a computer-readable storage medium such as the DVD-ROM 1201 or an IC card. The programs are read from the computer-readable storage medium, installed on the hard disk drive 1224, the RAM 1214 or the ROM 1230, which are also examples of a computer-readable storage medium, and executed by the CPU 1212. The information processing described in these programs is read into the computer 1200, resulting in cooperation between a program and the above-mentioned various types of hardware resources. An apparatus or method may be constituted by realizing the operation or processing of information in accordance with the usage of the computer 1200.

For example, if a communication is performed between the computer 1200 and external devices, the CPU 1212 may execute a communication program loaded on the RAM 1214, and instruct the communication interface 1222 to perform communication process based on the process described in the communication program. Under the control of the CPU 1212, the communication interface 1222 reads transmission data stored in a transmission buffer region provided in a recording medium such as the RAM 1214, the hard disk drive 1224, the DVD-ROM 1201 or an IC card, and sends the read transmission data to the network, or writes reception data received from the network into a reception buffer region or the like provided in the recording medium.

The CPU 1212 may also make all or required portions of the files or databases stored in an external recording medium such as the hard disk drive 1224, the DVD-ROM drive 1226 (DVD-ROM 1201) or an IC card to be read by the RAM 1214, and perform various types of processing on the data on the RAM 1214. The CPU 1212 may be configured to write hack the processed data to the external recording medium.

Various types of information such as various types of programs, data, tables and databases may be stored in the recording medium for information processing. The CPU 1212 may also be configured to execute various types of processing on the data read from the RAM 1214, which includes various types of operations, processing of information, condition judging, conditional branching, unconditional branching, search/replacement of information and the like described in the present disclosure and designated by an instruction sequence of programs, and to write the result back to the RAM 1214. The CPU 1212 may also be configured to search for information in a file, a database, etc., in the recording medium. For example, when a plurality of entries, each having an attribute value of a first attribute associated with an attribute value of a second attribute, are stored in the recording medium, the CPU 1212 may search the plurality of entries for an catty whose attribute value of the first attribute matches a designated condition, read the attribute value of the second attribute stored in the entry, and thereby acquire the attribute value of the second attribute associated with the first attribute that meets a predetermined condition.

The programs or software modules in the above description may be stored on the computer 1200 or a computer-readable storage medium near the computer 1200. Furthermore, a recording medium such as a hard disk or a RAM provided in a server system connected to a dedicated communication network or the Internet can be used as a computer-readable storage media, which provides programs to the computer 1200 via the network.

While the embodiments of the present invention have been described, the technical scope of the invention is not limited to the above described embodiments. It is apparent to persons skilled in the art that various alterations and improvements can be added to the above-described embodiments. Furthermore, to the extent that there is no technical contradiction, the matters described for the specific embodiment can be applied to other embodiments. Furthermore, each component may have features similar to those of other components which have the same name and have the different numerals. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES 10 system
20 vehicle
30 server
50 communication network
100 controller
101 communication section
103 control section
105 storage section
1200 computer
1201 DVD-ROM 1210 host controller
1212 CPU
1214 RAM
1216 graphics controller
1218 display device
1220 input/output controller
1222 communication interface
1224 hard disk drive
1226 DVD-ROM drive
1230 ROM
1240 input/output chip
1242 keyboard

What is claimed is:

1. A minimization method of minimizing a size of a file, wherein for each of a plurality of coordinates the file can optionally store data either as an absolute value or a relative value to a previous coordinate, the minimization method comprising:
preparing an absolute value length that is equal to or larger than a largest data length among data lengths of the data of the plurality of coordinates and a plurality of relative value lengths that is equal to or less than the absolute value length; and
in a case where it is assumed that, for each relative value length of the plurality of relative value lengths, among the data of the plurality of coordinates, data with a data length equal to or less than the relative value length is stored in the file as a relative value of the relative value length, and data with a data length larger than the relative value length is stored in the file as an absolute value of the absolute value length, identifying a relative value length among the plurality of relative value lengths causing minimization of the size.

2. The minimization method according to claim 1, wherein the preparing performs preparation from one bit by one bit as a plurality of relative value lengths that is equal to or less than the absolute value length.

3. The minimization method according to claim 1, wherein the identifying calculates, for each relative value length of the plurality of relative value lengths, a product of a number of data stored in the file as a relative value of the relative value length and a difference between the absolute value length and the relative value length, and identifies a relative value length resulting in a largest absolute value of the product as a relative value length causing minimization of the size.

4. The minimization method according to claim 2, wherein the identifying calculates, for each relative value length of the plurality of relative value lengths, a product of a number of data stored in the file as a relative value of the relative value length and a difference between the absolute value length and the relative value length, and identifies a relative value length resulting in a largest absolute value of the product as a relative value length causing minimization of the size.

5. The minimization method according to claim 3, wherein the identifying does not calculate the product for a relative value length, among each relative value length of the plurality of relative value lengths, that is larger than a largest data length among data lengths of the data of the plurality of coordinates.

6. The minimization method according to claim 4, wherein the identifying does not calculate the product for a relative value length, among each relative value length of the plurality of relative value lengths, that is larger than a largest data length among data lengths of the data of the plurality of coordinates.

7. The minimization method according to claim 1, wherein for each of the plurality of coordinates the file can optionally store the data as any of an absolute value, a relative value to a previous coordinate being an unsigned relative value with neither positive nor negative sign, or a relative value to a previous coordinate being a signed relative value with a positive or negative sign, the identifying including:
identifying a relative value length causing minimization of the size for each of the unsigned relative value and the signed relative value; and
comparing the size according to a relative value length identified in a case of the unsigned relative value to the size according to a relative value length identified in a case of the signed relative value, and then identifying a relative value length that causes the size to be smaller.

8. The minimization method according to claim 2, wherein for each of the plurality of coordinates the file can optionally store the data as any of an absolute value, a relative value to a previous coordinate being an unsigned relative value with neither positive nor negative sign, or a relative value to a previous coordinate being a signed relative value with a positive or negative sign, the identifying including:
identifying a relative value length causing minimization of the size for each of the unsigned relative value and the signed relative value; and
comparing the size according to a relative value length identified in a case of the unsigned relative value to the size according to a relative value length identified in a case of the signed relative value, and then identifying a relative value length that causes the size to be smaller.

9. The minimization method according to claim 3, wherein for each of the plurality of coordinates the file can optionally store the data as any of an absolute value, a relative value to a previous coordinate being an unsigned relative value with neither positive nor negative sign, or a relative value to a previous coordinate being a signed relative value with a positive or negative sign, the identifying including:
identifying a relative value length causing minimization of the size for each of the unsigned relative value and the signed relative value; and
comparing the size according to a relative value length identified in a case of the unsigned relative value to the size according to a relative value length identified in a case of the signed relative value, and then identifying a relative value length that causes the size to be smaller.

10. The minimization method according to claim 4, wherein for each of the plurality of coordinates the file can optionally store the data as any of an absolute value, a relative value to a previous coordinate being an unsigned relative value with neither positive nor negative sign, or a relative value to a previous coordinate being a signed relative value with a positive or negative sign, the identifying including:
identifying a relative value length causing minimization of the size for each of the unsigned relative value and the signed relative value; and
comparing the size according to a relative value length identified in a case of the unsigned relative value to the size according to a relative value length identified in a case of the signed relative value, and then identifying a relative value length that causes the size to be smaller.

11. The minimization method according to claim 5, wherein for each of the plurality of coordinates the file can optionally store the data as any of an absolute value, a relative value to a previous coordinate being an unsigned relative value with neither positive nor negative sign, or a relative value to a previous coordinate being a signed relative value with a positive or negative sign, the identifying including:

identifying a relative value length causing minimization of the size for each of the unsigned relative value and the signed relative value; and comparing the size according to a relative value length identified in a case of the unsigned relative value to the size according to a relative value length identified in a case of the signed relative value, and then identifying a relative value length that causes the size to be smaller.

12. The minimization method according to claim 6, wherein for each of the plurality of coordinates the file can optionally store the data as any of an absolute value, a relative value to a previous coordinate being an unsigned relative value with neither positive nor negative sign, or a relative value to a previous coordinate being a signed relative value with a positive or negative sign, the identifying including:

identifying a relative value length causing minimization of the size for each of the unsigned relative value and the signed relative value; and comparing the size according to a relative value length identified in a case of the unsigned relative value to the size according to a relative value length identified in a case of the signed relative value, and then identifying a relative value length that causes the size to be smaller.

13. The minimization method according to claim 7, wherein the identifying assumes that, in a case of the unsigned relative value, if a relative value to the previous coordinate is a negative value, an absolute value of the absolute value length is stored in the file.

14. The minimization method according to claim 8, wherein the identifying assumes that, in a case of the unsigned relative value, if a relative value to the previous coordinate is a negative value, an absolute value of the absolute value length is stored in the file.

15. The minimization method according to claim 1, wherein in a case where the absolute value length is one bit the identifying does not identify a relative value length causing minimization of the size and determines to store the data of the plurality of coordinates in the file as an absolute value of one bit.

16. The minimization method according to claim 1, wherein the identifying assumes that, in a case where data with a relative value to a previous coordinate is 0, a value of the data is not stored in the file.

17. The minimization method according to claim 1, wherein the identifying assumes that, if the data is in a state of not being obtained, is an abnormal value, or is in a state of being restricted, a value of the data is not stored in the file.

18. The minimization method according to claim 1, wherein for each of the plurality of coordinates, the file can optionally store the plurality of data with different types as any of an absolute value or a relative value to a previous coordinate, the method comprising the preparing and the identifying that are independent for each of the types.

19. A non-transitory computer-readable storage medium storing a program thereon which, when executed by a computer, causes the computer to minimize a size of a file, wherein for each of a plurality of coordinates, the file can optionally store data either as an absolute value or a relative value to a previous coordinate, the program causing the computer to perform:

preparing an absolute value length that is equal to or larger than a largest data length among data lengths of the data of the plurality of coordinates and a plurality of relative value lengths that is equal to or less than the absolute value length; and in a case where it is assumed that, for each relative value length of the plurality of relative value lengths, among the data of the plurality of coordinates, data with a data length equal to or less than the relative value length is stored in the file as a relative value of the relative value length, and data with a data length larger than the relative value length is stored in the file as an absolute value of the absolute value length, identifying a relative value length among the plurality of relative value lengths causing minimization of the size.

20. A minimization apparatus minimizing a size of a file, wherein for each of a plurality of coordinates the file can optionally store data either as an absolute value or a relative value to a previous coordinate, the minimization apparatus comprising:

a preparation section preparing an absolute value length that is equal to or larger than a largest data length among data lengths of the data of the plurality of coordinates and a plurality of relative value lengths that is equal to or less than the absolute value length; and identification section identifying, in a case where it is assumed that, for each relative value length of the plurality of relative value lengths, among the data of the plurality of coordinates, data with a data length equal to or less than the relative value length is stored in the file as a relative value of the relative value length, and data with a data length larger than the relative value length is stored in the file as an absolute value of the absolute value length, a relative value length among the plurality of relative value lengths causing minimization of the size.

* * * * *